(12) United States Patent
Takao

(10) Patent No.: US 7,615,823 B2
(45) Date of Patent: Nov. 10, 2009

(54) SOI SUBSTRATE AND METHOD OF MANUFACTURING THE SAME

(75) Inventor: Noriyuki Takao, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 383 days.

(21) Appl. No.: 11/593,013

(22) Filed: Nov. 6, 2006

(65) Prior Publication Data
US 2007/0108522 A1 May 17, 2007

(30) Foreign Application Priority Data
Nov. 14, 2005 (JP) ............... 2005-328331

(51) Int. Cl.
*H01L 27/01* (2006.01)
*H01L 21/20* (2006.01)
(52) U.S. Cl. ............... 257/347; 257/350; 257/E21.318; 257/E27.112; 438/479; 438/517
(58) Field of Classification Search ................ 257/347, 257/350; 438/149, 479, 517
See application file for complete search history.

(56) References Cited

U.S. PATENT DOCUMENTS 5,210,056 A * 5/1993 Pong et al. ............... 438/773
5,753,353 A * 5/1998 Kikuchi .................. 428/212
5,773,152 A * 6/1998 Okonogi .................. 428/446
6,211,041 B1 * 4/2001 Ogura ..................... 438/458

FOREIGN PATENT DOCUMENTS

JP 2004-199632 7/1992
JP 2004-320050 11/2004

* cited by examiner

*Primary Examiner*—Hsien-ming Lee
(74) *Attorney, Agent, or Firm*—Young & Thompson

(57) ABSTRACT

The SOI substrate includes a supporting substrate, an insulating layer (first insulating layer), another insulating layer (second insulating layer), and a silicon layer (silicon active layer). On a surface of the supporting substrate, which is the surface on the side of the silicon layer, the first insulating layer is provided. On a surface of the silicon layer, which is the surface on the side of the supporting substrate, the second insulating layer is provided. The supporting substrate and the silicon layer are adhered to each other, so that the interface between the first and the second insulating layers constitutes an adhesion plane. The adhesion plane performs as a gettering site in the SOI substrate.

13 Claims, 4 Drawing Sheets

SOI SUBSTRATE AND METHOD OF MANUFACTURING THE SAME

This application is based on Japanese patent application No. 2005-328331, the content of which is incorporated hereinto by reference.

BACKGROUND

1. Technical Field

The present invention relates to a SOI substrate and a method of manufacturing the same.

2. Related Art

Recently, a silicon-on-insulator (hereinafter, SOI) substrate has come to be more extensively employed as a semiconductor substrate for a semiconductor device. The SOI substrate includes a supporting substrate, an insulating layer provided on the supporting substrate, and a silicon layer provided on the insulating layer. The SOI substrate allows electrically isolating semiconductor chips such as transistors provided on the silicon layer, completely. Accordingly, the SOI substrate is superior to a bulk silicon substrate in level of integration, power saving, operation speed and so on.

Conventional SOI substrates include the one having a gettering site provided in the supporting substrate. The gettering site serves as a region for gettering a contaminant such as a heavy metal.

Japanese Laid-open patent publications No. H04-199632 (patent document 1) and No. 2004-320050 (patent document 2) disclose the SOI substrate having such a gettering site. The SOI substrate according to these documents includes the gettering site not in the supporting substrate, but in the insulating layer.

FIG. 4 is a cross-sectional view showing the SOI substrate according to the patent document 1. In the SOI substrate 100, an insulating layer 102, a sink layer 103, another insulating layer 104 and a silicon layer 105 are stacked in this sequence on a supporting substrate 101. Here, the sink layer 103 is constituted as a polycrystalline silicon layer for example, to thereby serve as the gettering site.

SUMMARY OF THE INVENTION

When the gettering site is provided in the supporting substrate, the contaminant in the silicon layer has to be diffused so as to go through the insulating layer, before reaching the gettering site. However, the insulating layer has to have a certain thickness in order to secure the electrical insulation, which restrains the mobility of the contaminant for reaching the gettering site.

In contrast, providing the layer that serves as the gettering site in the insulating layer as the SOI substrate shown in FIG. 4 permits the contaminant in the silicon layer to reach the gettering site, even when the overall thickness of the insulating layer (i.e. the distance between the silicon layer and the supporting substrate) is large.

When manufacturing such SOI substrate, however, the step of forming the layer that acts as the gettering site is additionally required, and hence the number of manufacturing processes is increased.

According to the present invention, there is provided a SOI substrate including a supporting substrate and a silicon layer adhered to each other, comprising: a first insulating layer provided on a surface of the supporting substrate on the side of the silicon layer; and a second insulating layer provided on a surface of the silicon layer on the side of the supporting substrate, wherein the supporting substrate and the silicon layer are adhered to each other so that an interface between the first and the second insulating layers constitutes an adhesion plane, and the adhesion plane performs as a gettering site.

In the SOI substrate thus constructed, the interface between the first insulating layer and the second insulating layer constitutes the adhesion plane between the supporting substrate and the silicon layer. Since such adhesion plane performs as the gettering site, the gettering effect can be secured without additionally forming a layer that acts as the gettering site. Accordingly, the manufacturing of this SOI substrate does not require the additional step of forming such layer, thus preventing the increase of the manufacturing processes.

According to the present invention, there is provided a method of manufacturing a SOI substrate, comprising: forming a first insulating layer on a supporting substrate; forming a second insulating layer on a silicon layer; and adhering the supporting substrate and the silicon layer to each other so that an interface between the first and the second insulating layers constitutes an adhesion plane, wherein the adhesion plane performs as a gettering site in the SOI substrate.

In the method thus arranged, the supporting substrate and the silicon layer are adhered to each other so that an interface between the first and the second insulating layers constitutes the adhesion plane. And since the adhesion plane performs as the gettering site in the SOI substrate to be fabricated, a sufficient gettering effect can be secured without additionally forming a layer that acts as the gettering site. Therefore, the foregoing method does not require the additional step of forming such layer, thus preventing the increase of the manufacturing processes.

Thus, the present invention provides a SOI substrate that offers a sufficient gettering effect without incurring an increase of manufacturing processes, and a method of manufacturing such SOI substrate.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an exemplary embodiment of a SOI substrate and a method of manufacturing the same according to the present invention will be described in details, referring to the accompanying drawings. In all the drawings, same constituents are given the same numerals, and the description thereof will not be repeated.

Figure 1:
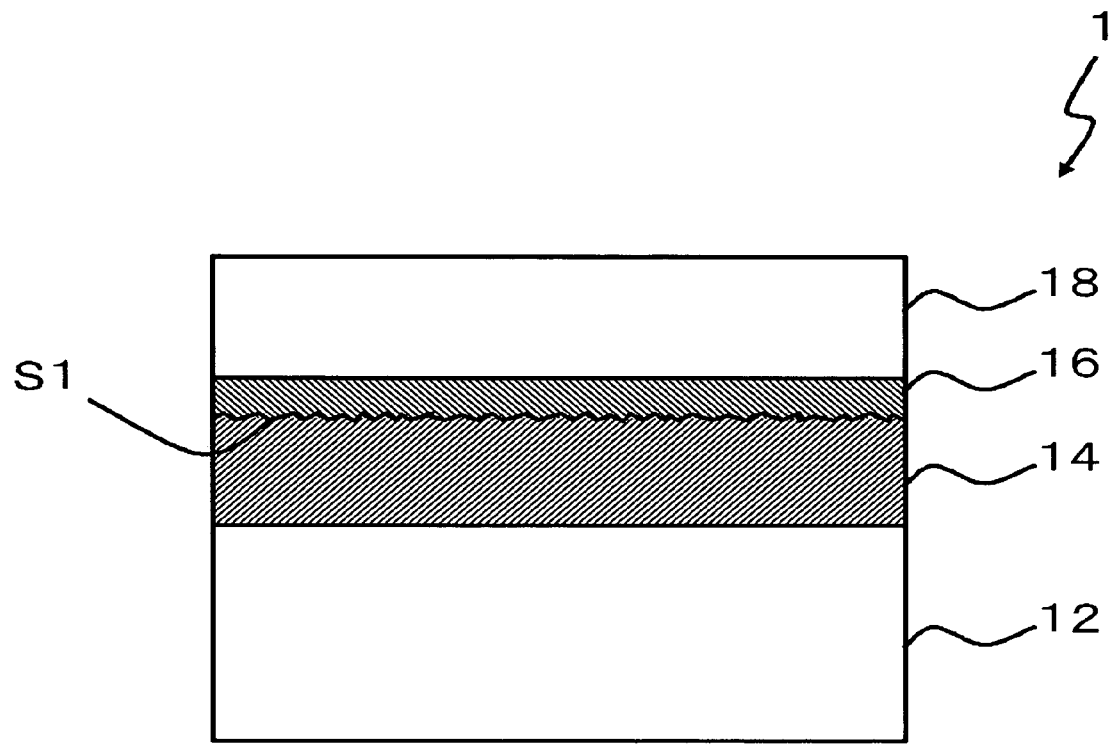
FIG. 1 is a cross-sectional view showing a SOI substrate according to an embodiment of the present invention.

FIG. 1 is a cross-sectional view showing the SOI substrate according to the embodiment of the present invention. The SOI substrate 1 includes a supporting substrate 12, an insulating layer 14 (first insulating layer), another insulating layer 16 (second insulating layer), and a silicon layer 18 (silicon active layer).

On a surface of the supporting substrate 12, which is the surface on the side of the silicon layer 18, the insulating layer 14 is provided. On a surface of the silicon layer 18, which is the surface on the side of the supporting substrate 12, the insulating layer 16 is provided. The supporting substrate 12 and the silicon layer 18 are adhered to each other, so that the interface between the insulating layer 14 and the insulating layer 16 constitutes an adhesion plane S1. The adhesion plane S1 performs as a gettering site in the SOI substrate 1.

Here, the supporting substrate 12 may be constituted of a silicon substrate. The supporting substrate 12 is formed in a thickness of, for instance, approx. several hundred microns. Although the material and thickness of the supporting substrate 12 is not specifically limited, it is preferable to determine so as to make the supporting substrate 12 sufficiently rigid and resistant against warping.

The insulating layers 14, 16 may be silicon oxide layers. The insulating layer 14 may be formed in a thickness of several microns. On the other hand, the insulating layer 16 is formed in a thickness that allows diffusion therethrough of a heavy metal in the silicon layer 18, so that the heavy metal may reach the adhesion plane S1. In this embodiment, the insulating layer 16 is thinner than the insulating layer 14. When the thickness of the insulating layer 16 is denoted by d, preferably d satisfies $0 < d \leq 20$ nm, and more preferably $0.4$ nm $\leq d \leq 20$ nm. Here, the insulating layers 14, 16 are both single-layer insulating layers.

It is preferable that the insulating layer 16 is formed in a thin film formation process. In the thin film formation process, for example, thermal oxidation, plasma oxidation or a CVD process is employed to form the insulating layer 16.

Figure 2:
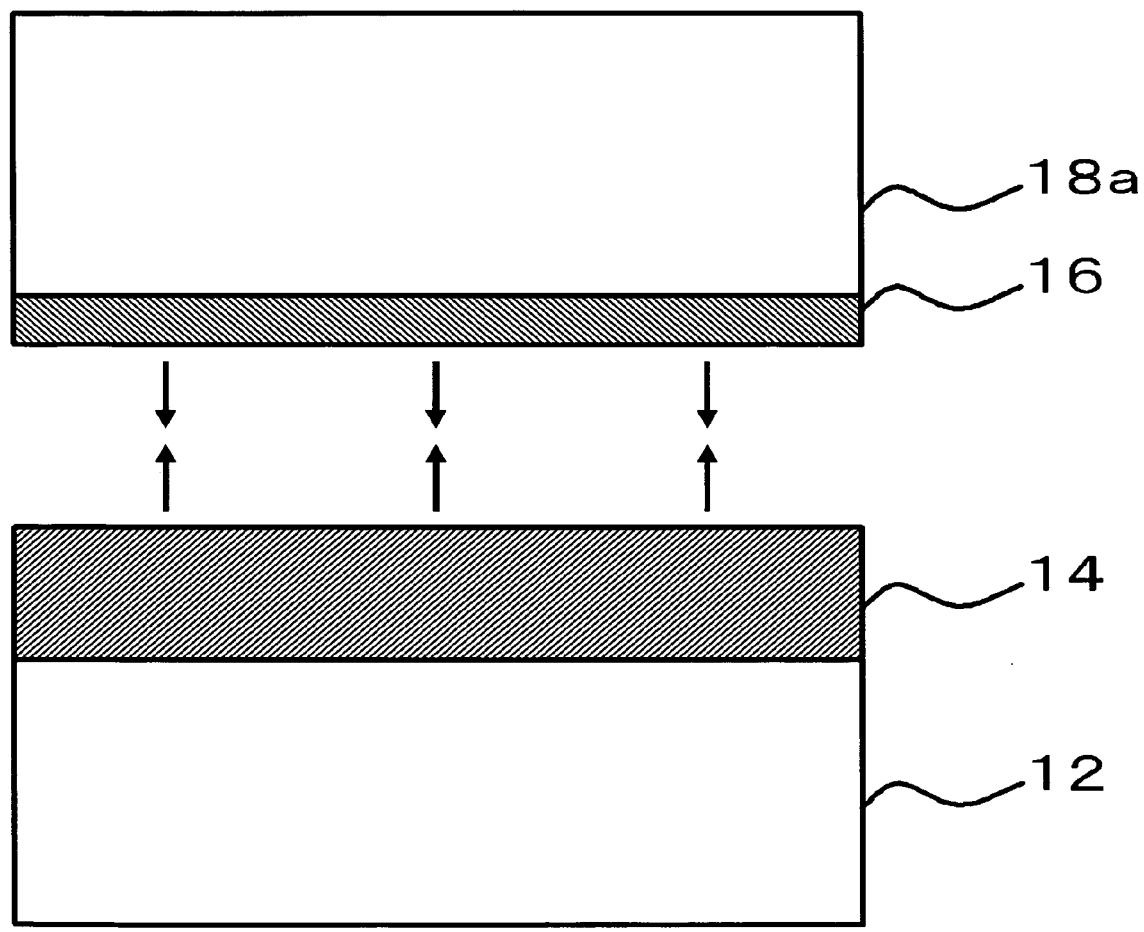
FIG. 2 is a cross-sectional view showing a method of manufacturing the SOI substrate according to an embodiment of the present invention.

Now referring to FIG. 2, a method of manufacturing the SOI substrate 1 will be described, as an embodiment of the method of manufacturing a SOI substrate according to the present invention. Firstly the insulating layer 14 is formed on the supporting substrate 12, and the insulating layer 16 is formed on a silicon layer 18a, which is to subsequently turn into the silicon layer 18. The silicon layer 18a may be formed in a thickness of approx. 300 μm. Here, the order of formation of the insulating layer 14 and the insulating layer 16 may be determined as desired. In other words, one of the insulating layers may be formed prior to the other, or the both may be formed at a time.

The insulating layer 14 may be formed by thermal oxidation, for example. The insulating layer 14 may be formed in a thickness of approx. 1 μm. Although the material and thickness of the insulating layer 14 is not specifically limited, it is preferable to determine in consideration of the resistance against warping and stress, insulation performance and field relaxation effect against the silicon layer 18, to be achieved when the manufacturing is completed.

It is preferable to employ the thin film formation process, to form the insulating layer 16. Before forming the insulating layer 16, a natural oxide layer formed on the silicon layer 18a may be removed.

Then the supporting substrate 12 with the insulating layer 14 now provided thereon and the silicon layer 18a with the insulating layer 16 now provided thereon are adhered to each other. In this process, the insulating layer 14 and the insulating layer 16 are made to directly oppose each other, so that an interface therebetween constitutes the adhesion plane. Such adhesion may be achieved by pressing the insulating layer 14 and the insulating layer 16 against each other under a high temperature of approx. 1100 degree centigrade. In this case, a high-temperature sintering may follow the pressing step if necessary. Alternatively, the insulating layer 14 and the insulating layer 16 may be subjected to a plasma process for activating the surface thereof, and then pressed against each other under a relatively low temperature such as 300 degree centigrade. In this case, a low-temperature sintering may follow the pressing step if necessary.

Thereafter the silicon layer 18a is polished to a predetermined thickness, thereby forming the silicon layer 18. At this stage, the SOI substrate 1 as shown in FIG. 1 is obtained.

The foregoing embodiment offers the following advantageous effects. In this embodiment, the interface between the insulating layer 14 and the insulating layer 16 constitutes the adhesion plane S1 between the supporting substrate 12 and the silicon layer 18, and the adhesion plane S1 performs as the gettering site. Accordingly, a sufficient gettering effect can be secured without additionally forming a layer that acts as the gettering site. A reason that the adhesion plane S1 provides the gettering effect is that the crystals become irregular in the adhesion plane S1. Therefore, the foregoing method of manufacturing the SOI substrate 1 does not require the additional step of forming such layer, thus preventing an increase of the manufacturing processes. Thus, the embodiment provides the SOI substrate 1 that offers a sufficient gettering effect without incurring the increase of manufacturing processes, and the method of manufacturing such SOI substrate.

On the contrary, in a SOI substrate in which the gettering site is provided in the supporting substrate, the mobility of a contaminant for reaching the gettering site is restrained, and hence a sufficient gettering effect cannot be achieved, as already stated. For example, the diffusivity of Fe and Ni in a thermal oxidation layer is less than a tenth of that in a semiconductor such as Si. Accordingly, those heavy metals can be barely diffused through an insulating layer, which usually has a thickness of several microns, and are hence kept from reaching the gettering site in the supporting substrate. Unlike such structure, in the SOI substrate 1 that has the gettering site in the interface between the insulating layer 14 and the insulating layer 16, the contaminant in the silicon layer 18 can easily reach the gettering site.

Figure 3:
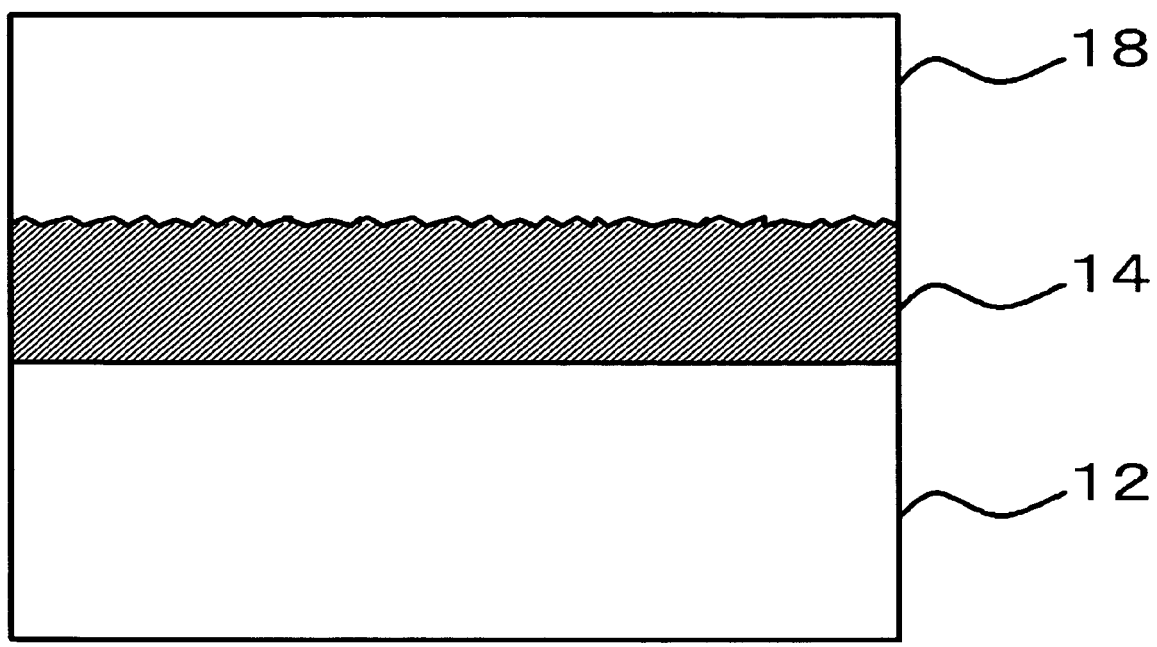
FIG. 3 is a cross-sectional view showing a SOI substrate according to a comparative example to the embodiment.
Figure 4:
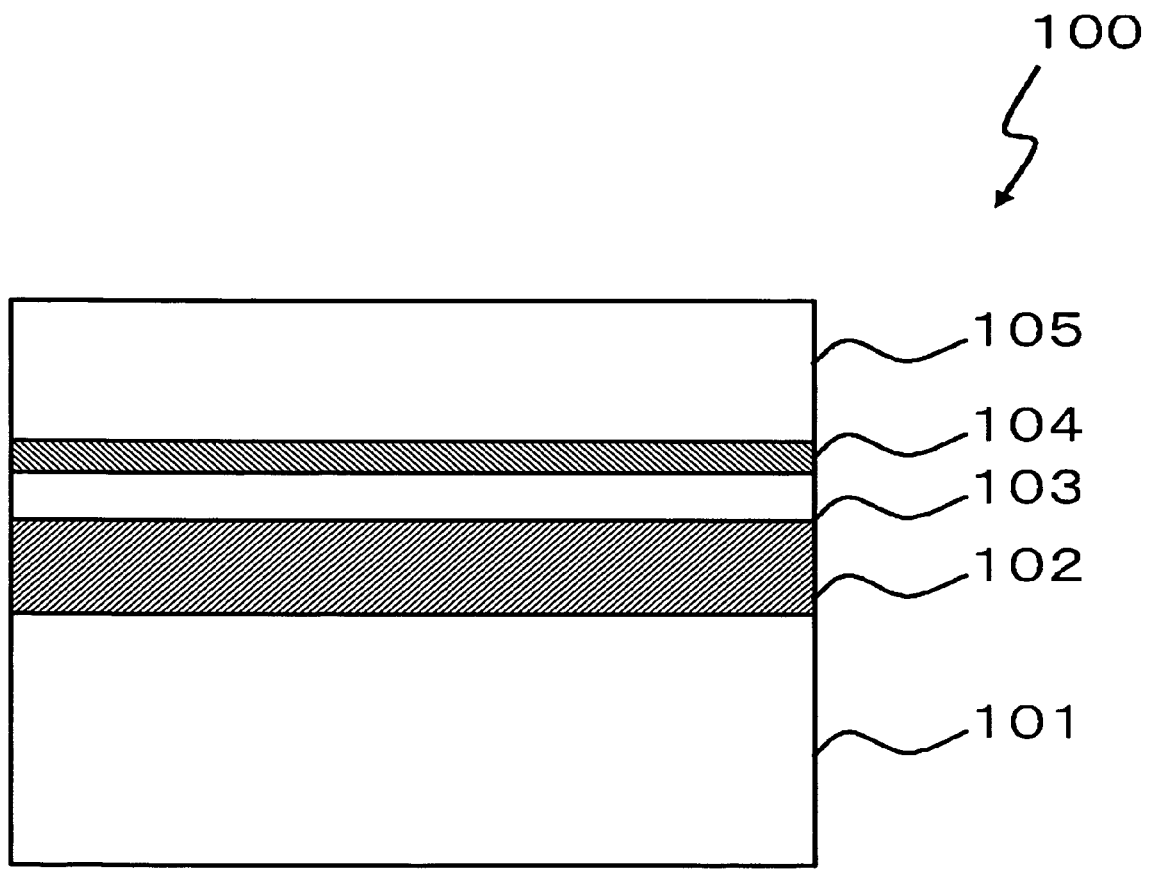
FIG. 4 is a cross-sectional view showing a conventional SOI substrate.

FIG. 3 is a cross-sectional view showing a SOI substrate according to a comparative example. In this SOI substrate, the insulating layer 16 (Ref. FIG. 1) is not provided on the silicon layer 18, and hence the interface between the silicon layer 18 and the insulating layer 14 constitutes the adhesion plane. It has been confirmed through experiment that the adhesion plane in the SOI substrate thus constructed can also perform as the gettering site. In the experiment, a silicon substrate was employed as the supporting substrate 12, and the insulating layer 14 was formed by thermal oxidation.

When the SOI substrate shown in FIG. 3 is employed as the substrate for a semiconductor device, however, leak current increases as voltage rises in the semiconductor device. Presumably, this is because the irregularity of crystals in the adhesion plane constitutes a core for generating a carrier, when a depletion layer of a FET (field effect transistor) and the like contacts the adhesion plane.

In contrast in the SOI substrate 1, while the crystals become irregular in the interface (adhesion plane S1) between the insulating layer 14 and the insulating layer 16, regular crystal interface is obtained in the interface between the silicon layer 18 and the insulating layer 16. Accordingly, even when the depletion layer contacts the interface between the silicon layer 18 and the insulating layer 16, the carrier is barely generated. Consequently, the SOI substrate 1 is capable, when employed as the substrate for a semiconductor device, of reducing the leak current in the semiconductor device.

The insulating layer 16 is formed in a thickness that allows diffusion therethrough of the heavy metal in the silicon layer 18 so that the heavy metal reaches the adhesion plane S1. Such structure secures sufficient mobility of the heavy metal in the silicon layer 18 for reaching the gettering site.

Forming the insulating layer 14 in a greater thickness than the insulating layer 16 allows securing sufficient electrical insulation with the relatively thick insulating layer 14, while granting sufficient mobility to the heavy metal in the silicon layer 18 for reaching the gettering site.

When the thickness d of the insulating layer 16 is 20 nm or less, the heavy metal in the silicon layer 18 can well reach the gettering site. From the viewpoint of permitting the heavy metal to reach the gettering site, it is preferable that d is 10 nm or less, and more preferably 5 nm or less.

When the thickness d is not less than 0.4 nm, the insulating layer 16 can effectively prevent the crystal irregularity in the adhesion plane S1 from provoking emergence of the leak current.

Employing a silicon substrate as the supporting substrate 12 facilitates making the supporting substrate 12 rigid and warp-resistant.

Employing the thin film formation process to form the insulating layer 16 facilitates forming the insulating layer 16 in a desired thickness, compared with a spontaneously formed insulating layer such as a natural oxide layer. Also, forming the insulating layer 16 by thermal oxidation allows obtaining especially desirable crystal interface between the silicon layer 18 and the insulating layer 16. Here, the insulating layer 16 may be a natural oxide layer.

Forming the insulating layer 16 after removing the natural oxide layer formed on the silicon layer 18a (Ref. FIG. 2) also leads to formation of an especially desirable crystal interface between the silicon layer 18 and the insulating layer 16. However, removing the natural oxide layer formed on the silicon layer 18a is not mandatory, but the insulating layer 16 may be formed on the silicon layer 18a via the natural oxide layer.

It is to be understood that the SOI substrate and the method of manufacturing the same are not limited to the foregoing embodiment, but various modifications may be made.

It is apparent that the present invention is not limited to the above embodiment, and may be modified and changed without departing from the scope and spirit of the invention.

What is claimed is:

1. A SOI substrate including a supporting substrate and a silicon layer adhered to each other, comprising:
   a first insulating layer provided on a surface of said supporting substrate facing said silicon layer; and
   a second insulating layer provided on a surface of said silicon layer facing said supporting substrate,
   wherein said supporting substrate and said silicon layer are adhered to each other so that said first insulating layer directly contacts said second insulating layer forming an interface between said first and said second insulating layers constituting an adhesion plane, and said adhesion plane performs as a gettering site.

2. The SOI substrate according to claim 1, wherein said second insulating layer is formed in a thickness that allows a heavy metal in said silicon layer to be diffused through said second insulating layer, so as to reach said adhesion plane.

3. The SOI substrate according to claim 1, wherein said second insulating layer is thinner than said first insulating layer.

4. The SOI substrate according to claim 1, wherein $0 < d \leq 20$ nm is satisfied, when d denotes a thickness of said second insulating layer.

5. The SOI substrate according to claim 4, wherein said d satisfies $0.4 \text{ nm} \leq d \leq 20$ nm.

6. The SOI substrate according to claim 1, wherein said supporting substrate is a silicon substrate.

7. The SOI substrate according to claim 1, wherein said second insulating layer is formed in a thin film formation process.

8. The SOI substrate according to claim 1, wherein said adhesion plane includes irregular crystals.

9. A method of manufacturing a SOI substrate, comprising:
   forming a first insulating layer on a supporting substrate;
   forming a second insulating layer on a silicon layer; and
   adhering said supporting substrate and said silicon layer to each other so that said first insulating layer directly contacts said second insulting layer thereby forming an interface between said first and said second insulating layers constituting an adhesion plane,
   wherein said adhesion plane performs as a gettering site in said SOI substrate.

10. The method according to claim 9, wherein said second insulating layer is formed in a thin film formation process.

11. The method according to claim 10, wherein said second insulating layer is formed by thermal oxidation.

12. The method according to claim 9, wherein said forming of said second insulating layer includes removing a natural oxide layer formed on said silicon layer, before forming said second insulating layer.

13. The method according to claim 9, wherein said adhesion plane includes irregular crystals.

* * * * *